(12) United States Patent
Asai et al.

(10) Patent No.: US 6,291,778 B1
(45) Date of Patent: *Sep. 18, 2001

(54) PRINTED CIRCUIT BOARDS

(75) Inventors: Motoo Asai; Masato Kawade; Shinji Hiratuka, all of Gifu (JP)

(73) Assignee: Ibiden, Co., Ltd., Gifu (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/765,451

(22) PCT Filed: Jun. 6, 1996

(86) PCT No.: PCT/JP96/01539

§ 371 Date: Jan. 22, 1997

§ 102(e) Date: Jan. 22, 1997

(87) PCT Pub. No.: WO96/39796

PCT Pub. Date: Dec. 12, 1996

(30) Foreign Application Priority Data

Jun. 6, 1995 (JP) .................................................. 7-139501
Jun. 12, 1995 (JP) .................................................. 7-144516

(51) Int. Cl.⁷ ........................................................... H01R 9/09
(52) U.S. Cl. ............................ 174/263; 257/692; 257/737; 257/738
(58) Field of Search ............................... 174/250, 263; 257/692, 666, 737, 738, 778

(56) References Cited

U.S. PATENT DOCUMENTS

| | | | |
|---|---|---|---|
| 4,118,595 | * | 10/1978 | Pfahnl et al. ........................ 174/256 |
| 4,766,268 | | 8/1988 | Uggowitzer . |
| 4,840,924 | * | 6/1989 | Kinbara ............................. 174/261 X |
| 4,866,507 | * | 9/1989 | Jacobs et al. ..................... 174/250 X |
| 5,252,781 | | 10/1993 | Shirai et al. . |
| 5,258,094 | | 11/1993 | Furui et al. . |
| 5,260,518 | | 11/1993 | Tanaka et al. . |
| 5,262,351 | * | 11/1993 | Bureau et al. . |
| 5,317,801 | | 6/1994 | Tanaka et al. . |
| 5,517,756 | | 5/1996 | Shirai et al. . |
| 5,559,372 | * | 9/1996 | Kwon ................................... 257/692 |

FOREIGN PATENT DOCUMENTS

| | | |
|---|---|---|
| 0239158 | 9/1987 | (EP) . |
| 0516402 | 12/1992 | (EP) . |
| 0618757 | 10/1994 | (EP) . |
| 3-11792 | 1/1991 | (JP) . |
| 4337695 | 11/1992 | (JP) . |
| 5206622 | 8/1993 | (JP) . |
| 6-53640 | 2/1994 | (JP) . |
| 6-69615 | 3/1994 | (JP) . |
| 6204631 | 7/1994 | (JP) . |
| 6-204631 | * 7/1994 | (JP) . |
| 6204655 | 7/1994 | (JP) . |
| 6350230 | 12/1994 | (JP) . |
| 7-94855 | 4/1995 | (JP) . |

OTHER PUBLICATIONS

An English language abstract of JP 6–204631.
Patent Abstracts of Japan, vol. 17, No. 640 (E–1465), Nov. 26, 1993.

* cited by examiner

Primary Examiner—Albert W. Paladini
(74) Attorney, Agent, or Firm—Greenblum & Bernstein, P.L.C.

(57) ABSTRACT

This invention is to provide a printed circuit board suitable for the high densification of mounting parts using a solder bump and for the improvements of connection reliability and mounting reliability, and proposes a printed circuit board comprising a mounting pad provided with a solder bump by covering a mounting surface with a solder resist, characterized in that a position of forming the solder bump is arranged so as to match with a position of a viahole, or a size of opening portion formed in the solder resist is made larger than a size of a land of the viahole so as not to overlap the solder resist with the viahole.

18 Claims, 3 Drawing Sheets

FIG. 5C

# PRINTED CIRCUIT BOARDS

TECHNICAL FIELD

This invention relates to a printed circuit board and more particularly to a printed circuit board suitable for the high densification of mounting-parts using a solder bump and for improvements of connection reliability and mounting reliability.

BACKGROUND ART

At the present, there has been a demand to obtain high performance electronic equipment. Lately, this demand has been strongly oriented towards super-miniaturization and reduction of thickness and weight in fields of mobile and portable electronic equipments. In the field of printed circuit boards, therefore, there is a demand for developing a technique corresponding to the high densification of mounting electronic parts (chips) onto a wiring substrate.

As the conventional technique suitable for the high densification of mounting the part, there is known a flip chip mounting method in which a solder bump is arranged on a surface mounting pad formed in the wiring substrate and the solder bump is joined to the chip.

Such a flip chip mounting is concretely a technique in which a conductor circuit including a mounting pad is formed on the mounting surface of the wiring substrate and then a solder is fed on the mounting pad through a solder resist to form a solder bump in an opening portion of the resist and thereafter the solder bump is subjected to a reflow treatment to conduct an electrical connection between the solder bump and an electronic part.

Figure 1A:
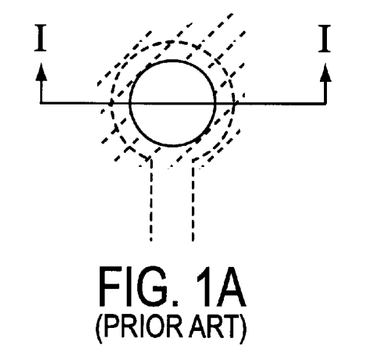
Figure 1B:
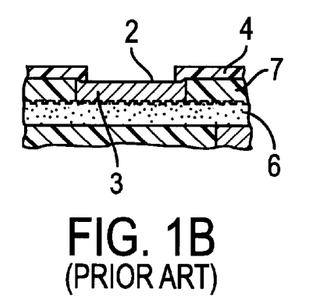
FIG. 1(b) is a partial sectional view taken along I—I of FIG. 1(a).
Figure 2:
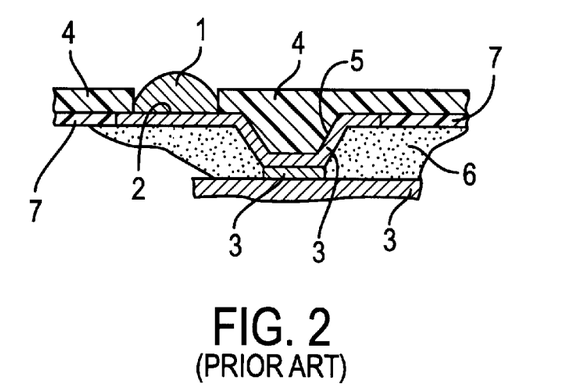
FIG. 2 is a partial sectional view illustrating a forming state of a solder bump in a conventional printed circuit board.

However, the flip chip mounting has a number of problems, as follows:

(1) In the flip chip mounting, the opening portion of the solder resist feeding the solder in the printed circuit board is formed by exposing portions other than the openings to a light through a photomask film printed with an opening pattern, dissolving and removing unexposed portions through development treatment and then conducting thermosetting. The thus formed opening portion of the solder resist has hitherto been constituted by making the size smaller than the size of the mounting pad and overlapping the edge of the opening portion with the outer peripheral edge (outer periphery of the pad) of the mounting pad as shown in FIG. 1. That is, opening edge of the solder resist locates on the surface of the pad. Therefore, when light is exposed on positions other than the opening of the solder resist, the difference in hardness through light exposure between an upper layer portion and a lower layer portion of the solder resist is caused due to deflection of incident light and the like. Particularly, the pad surface is easily subjected to an influence of light scattering produced on the surface. For this end, the curing through light exposure becomes insufficient at the boundary between the lower layer of the solder resist and the pad surface in the formation of the opening portion of the solder resist and hence the solder resist is eroded up to the position other that the opening portion by the development treatment. As a result, there is caused a problem that a gap is created in the boundary between the opening edge of the solder resist and the pad through the subsequent thermosetting.

(2) When the solder bump is formed on the mounting pad by feeding the solder to the opening portion of the solder resist in the printed circuit board, it is necessary that the surface of the mounting pad exposed in the opening portion of the solder resist is previously subjected to Ni/Au plating. In the conventional structure of the solder resist described in the above item (1), therefore, a plating solution sinks into the gap produced between the opening edge of the solder resist and the pad in the Ni/Au plating treatment and the precipitation of the plated film proceeds in this portion to conduct the penetration between the solder resist and the pad. As a result, there is caused a problem of causing the floating (peeling) in the opening edge of the solder resist.

(3) When the solder bump is formed on the mounting pad by feeding the solder into the opening portion of the solder resist in the printed circuit board, in order to avoid the drawbacks such as flowing of solder, solder bridge and the like, it is necessary to arrange a step difference between the mounting pad surface and the solder resist surface. Therefore, it is desirable to make the thickness of the solder resist thicker as far as possible. However, as the mounting pad becomes small in accordance with the high densification of mounting the part, it is very difficult to feed the solder to the pad and even if the step difference is arranged, there is caused a problem that the drawbacks such as solder flowing, solder bridge and the like can not be avoided in the formation of the solder bump on a small-size pad. Further, in the conventional structure of the solder resist described in the item (1), the solder contacts with the solder resist, so that there is a problem that crack is created from the contact point.

(4) There is a tendency that the area of the pad becomes small accompanied with the high densification of mounting the part through the reductions of the weight, thickness and length of the elctronic part. In order to cope with this tendency, it is necessary to form a fine opening portion in the solder resist and attain the improvement of the resolution of the solder resist. However, there is a problem that sufficient resolution is not obtained in the conventional structure of the solder resist described in the item (1) subjected to an influence of light scattering produced on the pad surface during the light exposure.

(5) In case of rendering the wiring substrate into multilayer, it is necessary that the viahole or through-hole existing on the mounting surface is completely clogged with the solder resist. However, it is very difficult to realize the complete clogging and hence there is a problem of leaving drawbacks such as bubble, unfilled portion and the like. These drawbacks bring about the occurrence of crack through thermal shock, burn out and the like and hence the connection reliability lowers.

(6) In case of rendering the wiring substrate into multilayer, it is general to connect the wiring substrate to the chip by newly wiring the mounting pad for the formation of the solder bump from the viahole. Therefore, there is a problem that the wiring length becomes longer to lower the wiring density and hence it is difficult to mount the part in a higher density.

SUMMARY OF THE INVENTION

It is an object of the invention to solve the aforementioned problems in the part mounting using the solder bump (flip chip mounting) and to provide a printed circuit board suitable for the high densification of mounting the part using the solder bump and for the improvements of the connection reliability and mounting reliability.

For this purpose, a first object is to provide a printed circuit board having a new structure that the resolution is excellent without causing the peeling of the solder resist and the solder bump for mounting the part can surely be fed to the pad surface.

A second object is to provide a printed circuit board having a new structure that the solder bump for mounting the part can surely be fed to the pad surface without lowering the wiring density and the connection reliability.

Moreover, JP-A-4-337695 discloses a technique of electrically connecting the wiring layers provided on both sides of the insulating layer through the solder. On the contrary, the invention is concerned with a new structure of solder resist and solder bump suitable for mounting electronic parts onto a wiring substrate, which is clearly different from the technique of JP-A-4-337695. Further, the technique disclosed in JP-A-4-337695 lies in a point that the solder is contacted with the insulating resin layer. Therefore, if this technique is applied to the invention, there are caused new problems that ① lead diffuses into the resin of the insulating layer to cause shortcircuit between the layers or between patterns, and ② the solder having a poor wettability to the resin is apt to be peeled off from the contact surface to the resin to drop off the viahole made from the solder. From these facts, the above conventional technique is impossible to realize the object of the invention.

DISCLOSURE OF THE INVENTION

The inventors have made various studies in order to achieve the above objects. As a result, the inventors found that it is effective to attain the first object by a structure that the opening portion of the solder resist is made larger than the size of the mounting pad so as not to overlap the resist with the pad.

Further, the inventors have found that it is effective to attain the second object by a structure that the solder bump is formed so as to match with the position of the viahole without wiring the pad for connecting the part.

The invention is based on the above knowledges and has the essential feature and construction as mentioned later.

(1) A printed circuit board comprising a conductor pattern inclusive of a mounting pad formed on a mounting surface and a solder resist covering the conductor pattern, characterized in that a size of an opening portion formed in the solder resist is made larger than the mounting pad so as not to overlap the solder resist with the pad (first invention).

(2) In the invention described in the item (1), it is desirable that a clearance created between an opening edge of the solder resist and an outer peripheral edge of the mounting pad is 20–60 $\mu$m.

(3) In the invention described in the item (1), it is desirable that the solder resist has a thickness of 15–30 $\mu$m.

(4) A printed circuit board comprising a solder bump formed on a mounting surface, characterized in that a position of forming the solder bump is arranged so as to match with a position of a viahole (second invention).

(5) A printed circuit board having a structure of alternately laminating conductor circuits and interlaminar insulating layers, in which the interlaminar insulating layer insulating between a surface layer of conductor circuit and an inner layer of conductor circuit is provided with an opening exposing the inner layer of conductor circuit and a viahole made from a metal film electrically connecting the surface layer of conductor circuit to the inner layer of conductor circuit and a solder bump is filled and formed in the viahole (third invention)

(6) In the invention described in the item (4) or (5), it is desirable that the solder bump is formed so as to fill the viahole on the mounting surface and cover a portion just above the viahole.

(7) In the invention described in the item (4) or (5), it is desirable that the viahole has a structure that the metal film for electrically connecting the inner conductor layer to the outer conductor layer is formed in a concave opening formed in the insulating layer provided on both surfaces with the conductor layers so as to expose the inner conductor layer from the surface of the insulating layer.

(8) In the invention described in the item (4) or (5), it is desirable that an opening diameter of the viahole having the solder bump is 50–220 $\mu$m.

(9) In the invention described in the item (4) or(5), it is desirable that a land size of the viahole having the solder bump is 80–300 $\mu$m.

(10) A printed circuit board comprising a mounting pad provided with a solder bump formed by covering a mounting surface with a solder resist, characterized in that a position forming the solder bump is matched with a position of a viahole and a size of an opening portion formed in the solder resist is made larger than a land size of the viahole so as not to overlap the solder resist with the viahole (fourth invention).

(11) A printed circuit board comprising a mounting pad provided with a solder bump formed by covering a mounting surface with a solder resist, characterized in that the printed circuit board has a structure of alternately laminating a conductor circuit and an interlaminar insulating layer, and the interlaminar insulating layer insulating a surface layer of the conductor circuit from an inner layer of the conductor circuit is provided with an opening portion exposing the inner layer of the conductor circuit, and a viahole made from a metal film electrically connecting the surface layer of the conductor circuit to the inner layer of the conductor circuit is formed in the opening portion, and the viahole is filled with the solder bump, and the size of the opening portion formed in the solder resist is made larger than a land size of the viahole so as not to overlap the solder resist with the viahole (fifth invention).

(12) In the invention described in the item (10) or (11), it is desirable that the solder bump is formed so as to fill the viahole on the mounting surface and cover a portion just above the viahole.

(13) In the invention described in the item (10) or (11), it is desirable that the viahole has a structure that the metal film for electrically connecting the inner conductor layer to the outer conductor layer is formed in a concave opening formed in the insulating layer provided on both surfaces with the conductor layers so as to expose the inner conductor layer from the surface of the insulating layer.

(14) In the invention described in the item (10) or (11), it is desirable that a clearance produced between an opening edge of the solder resist and an outer peripheral edge of the mounting pad is 20–60 $\mu$m.

(15) In the invention described in the item (10) or (11), it is desirable that a thickness of the solder resist is 15–30 $\mu$m.

(16) In the invention described in the item (10) or (11), it is desirable that an opening diameter of the viahole having the solder bump is 50–220 $\mu$m.

(17) In the invention described in the item (10) or (11), it is desirable that a land size of the viahole having the solder bump is 80–300 $\mu$m.

BRIEF DESCRIPTION OF THE DRAWINGS

FIG. 1(*a*) illustrates an opening shape of a solder resist in a conventional printed circuit board.

In the drawings, numeral 1 is a solder bump, numeral 2 a mounting pad, numeral 3 a conductor (conductor circuit), numeral 4 a solder resist, numeral 5 a viahole, numeral 6 an insulating layer, numeral 7 a plated resist (permanent resist), symbol X an opening size of the solder resist, symbol Y an opening size of the viahole, symbol Z a land size of the viahole, symbol ΔX a clearance created between an opening edge of the solder resist and an outer peripheral edge of the mounting pad.

BEST MODE FOR CARRYING OUT THE INVENTION

Figure 3A:
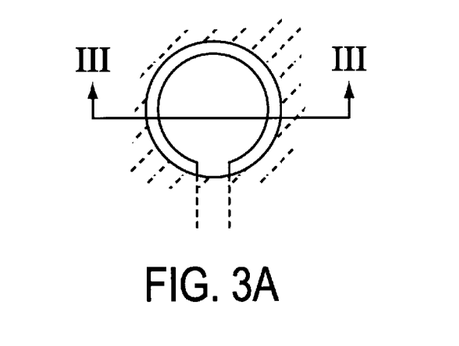
FIG. 3(a) illustrates an opening shape of a solder resist in a printed circuit board according to the present invention.
Figure 3B:
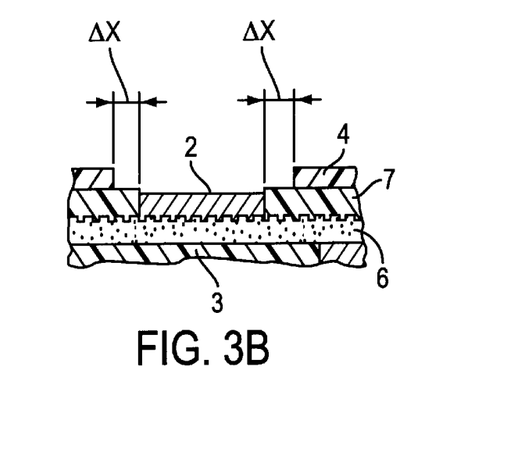
FIG. 3(b) is a partial sectional view taken along III—III of FIG. 3(a).

The printed circuit board according to the first invention lies in an opening shape of the solder resist so as not to leave the solder resist on the pad as shown in FIG. 3 or a structure that the size of the solder resist is made larger than the size of the mounting pad so as not to overlap the solder resist with the pad.

Such a structure is not influenced by light scattering or the like produced on the pad surface in the light exposure, so that the curing degree at the boundary between the opening edge of the solder resist and the pad is improved as compared with the conventional structure and hence there can be solved a problem that the gap is created through the development. As a result, there can be solved a problem that the plating solution sinks into the gap in the Ni/Au plating treatment and the precipitation of plated film proceeds in this portion to cause the peeling in the opening edge of the solder resist.

Further, the above structure widens the acceptable range of the resolution accompanied with the reduction of the pad size and is not influenced by the light scattering or the like produced on the pad surface in the light exposure, so that it is possible to cope with the mounting in a higher density.

Particularly, when the printed circuit board is produced by the additive process in which an adhesive layer for electroless plating is formed on a substrate and the surface thereof is roughened and a plated resist and a conductor pattern including a mounting pad is formed on the roughened surface and then the plated resist, mounting pad and conductor pattern are covered with a solder resist, the solder does not contact with the solder resist and the crack hardly occurs. In view of the above and in view of the drawings, the solder resist has a bottom surface located at a higher position than a top surface of the conductor pattern. In the printed circuit board through the additive process, the plated resist (permanent resist) remains as it is, so that even if the opening size of the solder resist is made large, the flowing of the solder is not caused owing to the step difference between the permanent resist and the mounting pad.

Moreover, the structure that the opening size of the solder resist is made larger than the size of the pad is advantageous in case of forming the solder bump through a solder transfer process. The solder transfer process is a process wherein a pattern of a solder foil is formed on places corresponding to positions of pads by etching the solder foil attached to a film of a resin, such as polyethylene terephthalate or the like, and the pattern of the solder foil is placed on the pad so as to contact therewith and heated and reflowed to transfer the solder to the pad. In such a solder transfer process, the area of the solder foil pattern formed on the film is generally larger than the pad. For this end, when the opening size of the solder resist is made larger than the size of the pad, the solder pattern just fits into the opening portion of the solder resist, which facilitates the positioning in the transfer.

In the printed circuit board according to the invention, it is desirable that the clearance created between the opening edge of the solder resist and the outer peripheral edge of the mounting pad is 20–60 μm. In the invention, it is necessary that the opening portion is formed in the solder resist so as not to overlap with the pad, so that when the clearance is less than 20 μm, the alignment between the opening portion of the solder resist and the pad portion is difficult. Further, when the pad is subjected to Ni/Au plating after the formation of the solder resist, the plating solution is apt to remain on the edge of the solder resist. As a result, when the clearance is small, the residual plating solution is apt to be applied onto the pad and hence the wettability to the solder is poor in the formation of the solder bump and the connection reliability lowers. On the other hand, when the clearance is more than 60 μm, it is apt to cause the lowering of wiring density, shortcircuit due to exposure of adjoining pad and the like, and also drawbacks such as solder bridge and the like are apt to be caused due to the formation of enormous solder bump, lateral widening of bump in the mounting of the part and the like.

Moreover, the clearance created between the opening edge of the solder resist and the outer peripheral edge of the mounting pad means a gap produced between the opening edge of the solder resist and the outer peripheral edge of the mounting pad.

In the printed circuit board according to the invention, the thickness of the solder resist is desirable to be 15–30 μm. When the thickness is less than 15 μm, the effect of the solder resist as a solder dam is not obtained and the shieldability for the wiring circuit lowers. Further, the unevenness of the lower layer is easily affected and there is a fear of exposing the lower layer. Particularly, the problem pointed out in the conventional technique, that is, a problem that the curing degree of the lower layer of the solder resist becomes insufficient to cause the floating (peeling) of the solder resist is remarkable when the thickness of the solder resist is not less than 15 μm. Therefore, the structure according to the invention is particularly effective when the thickness of the solder resist is not less than 15 μm as restricted above. On the other hand, when the thickness exceeds 30 μm, the light exposure and development are difficult and the large difference in the curing degree through light exposure between the lower layer and the upper layer in the solder resist is created, so that even if the structure of the invention is adopted, the peeling created in the opening edge of the solder resist can not be prevented. Particularly, in the printed circuit board through the additive process, it is necessary that the thickness of the solder resist is not more than 30 μm. Because, in the additive process, the solder resist is formed on the plated (permanent) resist, so that the step difference (between pad surface and upper surface of solder bump) becomes large and the mounting is difficult.

From the aforementioned reasons, when the thickness of the solder resist is restricted to 15–30 $\mu$m, the peeling of the solder resist peculiarly created can be prevented.

Figure 4:
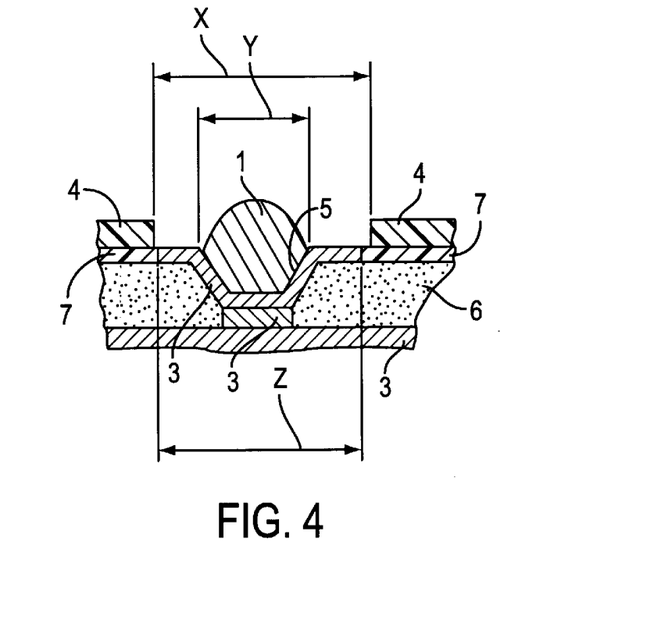
FIG. 4 is a partial sectional view illustrating a forming state of a solder bump in the printed circuit board according to the invention.

The printed circuit board according to the second invention lies in a point that the position of forming the solder bump is arranged so as to match with the position of the viahole as shown in FIG. 4, particularly a structure that the solder bump is filled in the viahole on the mounting surface and formed so as to cover a portion just above the viahole. Particularly, the viahole is desirable to have a structure that an opening portion is formed so as to pass through the interlaminar insulating layer providing the insulation between the surface layer of conductor circuit and the inner layer of conductor circuit and covered with a metal coating electrically connecting the inner conductor layer to the surface conductor layer in the printed circuit board having a structure of alternately laminating the conductor circuits and the interlaminar insulating layers (third invention).

In such a structure, it is not required to conduct the new wiring of the pad for the formation of the solder bump from the viahole, and hence the wiring length can be shortened and the improvement of the wiring density can be attained.

In the above structure, the inside of the viahole is completely filled with the solder bump. As a result, it is not necessary to fill the solder resist or the like in the viahole, so that there can be solved the problem of the conventional technique that the drawbacks such as bubble, unfilled portion and the like remain in the filling of the solder resist. This is due to the fact that the solder is uniformly and completely filled in the viahole through fusion. Further, the printed circuit board having the above structure according to the invention is also excellent in the electrical connection reliability because the inside of the viahole is completely filled.

According to the structure, the solder bump is filled and formed in the concave portion of the viahole made from the metal coating. As a result, the solder bump does not directly contact with the resin of the insulating resin layer, so that there is no breakage of the insulation between the layers or between the patterns due to diffusion of lead even under high-temperature and high-humidity conditions. Moreover, the solder does not close to the resin, so that the peeling is caused when the viahole is made from the solder. In this connection, the solder bump according to the invention contacts with only the metal coating constituting the viahole, so that it is excellent in the adhesion property to the metal coating. And also, the solder bump is formed by filling in the concave portion of the viahole, so that the amount of solder used may be made large and it is possible to conduct the accurate mounting of the part through self-alignment effect based on surface tension. Further, it is desirable that the metal coatings of nickel and gold are formed on the surface of the viahole according to the invention from the surface side of the viahole. Nickel is excellent in the affinity with copper, while gold is excellent in the affinity with nickel and solder.

In the printed circuit board according to the invention, it is desirable that the opening size of the viahole is 50–220 $\mu$m. When the opening size of the viahole 5 is less than 50 $\mu$m, the size of the solder bump is restricted to a small level and hence the electrical connection reliability to the part is degraded and also the contact area between the viahole and the conductor layer located therebeneath becomes small to degrade the electrical connection reliability to the inner circuit layer. On the other hand, when the opening size of the viahole exceeds 220 $\mu$m, the solder bump is too large and the drawback such as solder bridge or the like is apt to be caused on the side of the part to be connected, and also it hardly copes with the pitch of the flip chip so as not to obtain the effect of improving the wiring density.

In the printed circuit board according to the invention, it is desirable that the land diameter of the viahole is 80–300 $\mu$m. As the opening size of the viahole becomes small, the amount of the solder fed may be decreased, but when the land diameter is less than 80 $\mu$m, the solder bump can not completely be filled in the viahole and formed so as to make higher than the solder resist. On the other hand, when the land diameter exceeds 300 $\mu$m, the solder bump is inversely too large and hence the drawbacks such as solder bridge and the like are apt to be caused on the side of the part to be connected and the mounting density and wiring density lower. Moreover, the lowering of the mounting density is caused due to the fact that the mounting area is decreased by the increased portion of the solder bump though the necessary mounting number is unchangeable.

The printed circuit boards according to the fourth and fifth inventions lie in a point that the structure of the solder resist in the first invention is adopted in the printed circuit board according to the second or third invention. According to such a structure, the printed circuit board according to the fourth or fifth invention has the following effects.

①. In the printed circuit board according to the invention, the position of forming the solder bump is arranged so as to match with the position of the viahole, so that it is not necessary to conduct the new wiring of the pad for the formation of the bump and the wiring length can be shortened and the improvement of the wiring density can be attained. Thus, it can easily cope with the reduction of weight, thickness and length of the substrate.

②. In the printed circuit board according to the invention, the solder bump is filled in the viahole on the mounting surface and formed so as to cover a portion just above the viahole and the opening size of the solder resist is set to be larger than the opening size of the viahole, so that the conditions required in the resist such as resolution, thickness and the like are mitigated and the selection width of the solder resist to be used becomes wide. Furthermore, conditions of feeding the solder become moderate because the restriction of the resolution for forming the solder pattern on the transferring plate is mitigated in the solder transfer process, and the restriction on the resolution in the formation of mask such as a metal mask or the like is mitigated in the cream printing process. Moreover, the opening size of the solder resist is larger than the land diameter of the viahole, so that even if the shifting is caused between both the opening positions, the position shifting of the solder bump may be decreased. Therefore, according to the invention, the printed circuit board surely forming the solder bump can be provided without causing the peeling of the solder resist, which is effective to improve the yield of the printed circuit board and reduce the cost.

③. The printed circuit board according to the invention has a structure that the solder bump can completely be filled in the viahole, so that it is not necessary to fill the solder resist or the like in the viahole and there can be solved a problem that the drawbacks such as bubble, unfilled portion and the like remain in the filling. Further, the viahole is completely filled, so that the electrical connection reliability is excellent.

④. In the printed circuit board according to the invention, the solder bump is filled in the concave portion of the viahole and the solder amount thereof is large as compared with the solder bump having the same size formed on the conventional mounting pad, so that the mounting reliability in the mounting of the electronic part is improved. In electronic parts having pins such as DIP or the like, there is particularly obtained an effect of easily aligning the parts by inserting the pin into the concave portion.

⑤. In the printed circuit board according to the invention, the solder bump is filled and formed in the concave portion of the viahole made from the metal coating, so that the solder bump does not directly contact with the resin of the insulating resin layer and there is caused no breakage of insulation between the layers or between the patterns due to the diffusion of lead even under high-temperature and high-humidity conditions. Furthermore, the solder bump according to the invention contacts with only the metal coating constituting the viahole, so that the adhesion property to the metal coating is excellent.

A typical production method of an embodiment of the printed circuit board according to the invention will be described below.

(1) At first, an inner layer of copper pattern is formed on a substrate.

The formation of the copper pattern on the substrate is carried out by etching a copper lined laminate, or by a method wherein an adhesive layer for an electroless plating is formed on a substrate such as glass epoxy substrate, resin substrate, e.g., polyimide substrate, ceramic substrate, metal substrate or the like and the surface of the adhesive layer is roughened and then subjected to an electroless plating.

Particularly, it is desirable that when the copper pattern is formed by etching the copper lined laminate, a non-solvent resin (epoxy resin or polyimide resin) is applied, cured, polished to expose the copper pattern to thereby smoothen the surface of the substrate. Such a smoothening of the substrate surface easily conduct the light exposure and development because the thickness of the photosensitive insulating resin layer formed on the substrate surface becomes uniform.

(2) Then, an interlaminar insulating layer is formed on the inner layer of copper pattern formed in the item (1).

The interlaminar insulating layer is desirable to be made from a thermosetting resin such as epoxy resin, polyimide resin, bismaleimide triazine resin, phenolic resin or the like; a photosensitive resin obtained by photosensitization of these resins; a thermoplastic resin such as polyether sulphone or the like; a composite of the thermoplastic resin and the thermosetting resin; or a composite of the thermoplastic resin and the photosensitive resin.

The surface of these resin layers may be subjected to a roughening treatment with an oxidizing agent, an acid, an alkali or the like. By such a roughening, the adhesion to the conductor circuit formed on the surface can be improved.

As the interlaminar insulating material, it is particularly desirable to use an adhesive for electroless plating. The adhesive for electroless plating is optimum to be obtained by dispersing heat-resistant resin particles soluble in acid or oxidizing agent into heat-resistant resin hardly soluble in acid or oxidizing agent. This is due to the fact that the heat-resistant resin particles soluble in acid or oxidizing agent are roughened and removed, whereby octopus trap-shaped anchors can be formed on the surface to improve the adhesion property to the conductor circuit.

In the adhesive, it is desirable that a photosensitized thermosetting resin or a composite of a photosensitized thermosetting resin and a thermoplastic resin is used as the heat-resistant resin hardly soluble in acid or oxidizing agent. Because, the viahole can easily be formed by light exposure and development owing to the photosensitization. Furthermore, the toughness can be improved by compositing with the thermoplastic resin, whereby the improvement of peel strength in the conductor circuit and the prevention of the occurrence of cracks in the viahole portion by heat cycle can be attained.

Concretely, there are an epoxy acrylate obtained by reacting the epoxy resin with acrylic acid, methacrylic acid or the like, and a composite of epoxy acrylate and polyether sulphone. As the epoxy acrylate, it is desirable to react 20–80% of total epoxy group with acrylic acid, methacrylic acid or the like.

In the above adhesive, the heat-resistant resin particles is desirable to be selected from ① heat-resistant resin powder having an average particle size of not more than 10 $\mu$m, ② agglomerate particles having an average particle size larger by 3 times or more than that of powder and obtained by agglomerating heat-resistant resin powder having an average particle size of not more than 2 $\mu$m, ③ a mixture of heat-resistant resin powder having an average particle size of not more than 10 $\mu$m and heat-resistant resin powder having an average particle size of not more than 1/5 of the particle size of the above powder but not more than 2 $\mu$m, and ④ false particles obtained by adhering at least one of heat-resistant resin powder having an average particle size of not more than 2 $\mu$m and inorganic powder to surfaces of heat-resistant resin powder having an average particle size of 2 $\mu$m–10 $\mu$m. They can form complicated anchors. As the heat-resistant resin, epoxy resin, amino resin (melamine resin, urea resin, guanamine resin) are favorable. Particularly, the solubility of the epoxy resin to acid or oxidizing agent can be changed by varying the kind of oligomer, kind of curing agent and crosslinking density. For example, the resin obtained by treating bisphenol A-type epoxy resin oligomer with an amine type curing agent is easily dissolved in the oxidizing agent. However, the resin obtained by treating novolac epoxy resin oligomer with an imidazole type curing agent is hardly dissolved in the oxidizing agent.

As the acid used in the invention, there are phosphoric acid, hydrochloric acid, sulfuric acid, and organic acids such as formic acid, acetic acid and so on. Particularly, the organic acid is preferable. Because, when it is subjected to the roughening treatment, it hardly corrodes the metal conductor layer exposed from the viahole. As the oxidizing agent, it is preferable to use chromic acid, permanganate (potassium permanganate or the like). Especially, when the amino resin is dissolved and removed, it is desirable to alternately conduct the roughening treatment with acid and oxidizing agent.

In the printed circuit board according to the invention, a plurality of interlaminar insulating layers may be used. For instance, there are the following forms in case of using the plural layers.

① The interlaminar insulating layer of two-layer structure arranged between the upper layer of conductor circuit and lower layer of conductor circuit in which the side near to the upper layer of conductor circuit is an adhesive for electroless plating formed by dispersing heat-resistant resin particles soluble in acid or oxidizing agent into heat-resistant resin hardly soluble in acid or oxidizing agent and the side near to the lower layer of conductor circuit.

In this structure, there is caused no shortcircuit between the layers when the adhesive layer for electroless plating is too roughened by the roughening treatment.

(2) The interlaminar insulating layer of three-layer structure arranged between the upper layer of conductor circuit and the lower layer of conductor circuit in which a filling resin is embedded between the lower layers of conductor circuit so as to render the lower layer of the conductor circuit and the filling resin into the same plane, a heat-resistant layer hardly soluble in acid or oxidizing agent is formed thereon and an adhesive for electroless plating is formed thereon by dispersing heat-resistant resin particles soluble in acid or oxidizing agent into heat-resistant resin hardly soluble in acid or oxidizing agent.

In this structure, the filled resin is filled between the lower layers of conductor circuit, so that the surface of the substrate becomes smooth and there is no poor phenomenon of causing the scattering of the thickness. Further, inorganic particles such as silica or the like is included in the filling resin, whereby the shrinkage through curing can be reduced to prevent the warping of the substrate. Moreover, the non-solvent resin is desirable as the filling resin, and particularly non-solvent epoxy resin is optimum. When using the solvent, the remaining solvent is evaporated by heating to cause the interlaminar peeling.

(3) After the interlaminar insulating layer formed in the item (2) is dried, an opening portion for viahole is formed by light exposure and development in case of the photosensitive resin, or by thermosetting and laser work in case of the thermosetting resin.

(4) The surface of the interlaminar insulating layer is roughened and a catalyst nucleus is applied thereto. The catalyst nucleus is desirable to be noble metal ion, colloid or the like, and palladium chloride or palladium colloid is generally used. Moreover, it is desirable to conduct the heating treatment for fixing the catalyst nucleus.

(5) After the application of the catalyst nucleus in the item (4), the plated resist is formed. As the plated resist, use may be made of commercially available product, or a composition comprising epoxy acrylate obtained by reacting epoxy resin with acrylic acid, methacrylic acid or the like and an imidazole type curing agent, and a composition comprising epoxy acrylate, polyether sulphone and an imidazole type curing agent.

In this case, a ratio of epoxy acrylate and polyether sulphone is desirable to be about 50/50–80/20. When the epoxy acrylate is too large, the flexibility lowers, while when it is too small, the photosensitivity, resistance to base, resistance to acid and resistance to oxidizing agent lower.

As the epoxy acrylate, 20–80% of total epoxy groups are desirable to be reacted with acrylic acid, methacrylic acid or the like. When the acrylation ratio is too high, the hydrophilic property through OH group becomes high and the moisture absorption rises, while when the acrylation ratio is too low, the resolution is degraded.

As the epoxy resin being a fundamental skeleton resin, novolac type epoxy resin is desirable. Because, it is high in the crosslinking density, and can adjust its water absorption after the curing to not more than 0.1%, and is excellent in the resistance to base. As the novolac type epoxy resin, there are cresol novolac type and phenol novolac type.

(6) A portion not forming the plated resist in the treatment of the item (5) is subjected to a primary plating. In this case, not only the copper pattern but also the viahole are formed.

As the primary plating, it is desirable to be an alloy plating using at least two metal ions selected from copper, nickel, cobalt and phosphorus. Because, these alloys are high in the strength and can improve the peel strength.

In the electroless plating solution for the primary plating, it is desirable that a reducing agent reducing a metal ion to a metal element is at least one selected from aldehyde, hypophosphate (called as phosphinate), boron hydride and hydrazine. These reducing agents are soluble in water and excellent in the reducing force. Particularly, hypophosphate is desirable in view of the precipitation of nickel.

In the electroless plating solution for the primary plating, it is desirable to use at least one basic compound selected from sodium hydroxide, potassium hydroxide and calcium hydroxide as a pH adjusting agent for the adjustment to basic conditions. Under the basic conditions, hydroxycarboxylic acid forms a complex with nickel ion or the like. As the hydroxycarboxylic acid, succinic acid, malic acid, tartaric acid and the like are desirable. They easily form a complex with nickel, cobalt and copper. The concentration of the hydroxycarboxylic acid is desirable to be 0.1–0.8M. When it is less than 0.1M, the complex can not sufficiently be formed and abnormal precipitation and decomposition of the solution create, while when it exceeds 0.8M, there are caused inconveniences that the precipitation rate becomes slow and the occurrence of hydrogen is frequent.

The electroless plating solution for the primary plating is desirable to contain bipyridyl. Because, bipyridyl can control the occurrence of metal oxide in the plating bath to suppress the occurrence of nodule.

Moreover, copper ion, nickel ion and cobalt ion are supplied by dissolving compounds of copper, nickel and cobalt such as copper sulfate, nickel sulfate, cobalt sulfate, copper chloride, nickel chloride, cobalt chloride and the like.

The primary plated film made from the electroless plating solution is excellent in the followability to the roughened surface of the adhesive layer for electroless plating and traces the form of the roughened as it is. Therefore, the primary plated film has the same anchor as the roughened surface. Therefore, the secondary plated film formed on the primary plated film ensures the adhesion property owing to the anchor. Thus, the primary plated film is desirable that the strength precipitated by the aforementioned electroless plating solution is high for controlling the peel strength. Since the secondary plated film is desirable to be high in the electrical conductivity and fast in the precipitation rate, it is favorable to be a plated film precipitating from, a simple copper plating solution rather than a composite plating.

(7) The primary plated film formed in the item (6) is subjected to a secondary plating to form conductor circuit including viahole. The plated film through the secondary plating is desirable to be a copper plated film.

As the electroless plating solution for the secondary plating, it is desirable to use an electroless copper plating solution comprising copper ion, trialkanol amine, reducing agent and pH adjusting agent that the concentration of the copper ion is 0.005–0.015 mol/l, the concentration of the pH adjusting agent is 0.25–0.35 mol/l and the concentration of the reducing agent is 0.01–0.04 mol/l/. This plating solution is stable in the bath and less in the occurrence of nodule or the like.

In the electroless plating solution for the secondary plating, it is desirable that the concentration of trialkanol amine is 0.1–0.8M. The plating precipitation reaction is most proceeding within this range. The trialkanol amine is desirable to be at least one selected from triethanol amine, triisopanol amine, trimethanol amine and tripropanol amine. They are soluble in water.

In the electroless plating solution for the secondary plating, the reducing agent is desirable to be at least one selected from aldehyde, hypophosphate, boron hydride and hydrazine. It is soluble in water and has a reducing force under basic conditions. The pH adjusting agent is desirable to be at least one selected from sodium hydroxide, potassium hydroxide and calcium hydroxide.

Figure 5A:
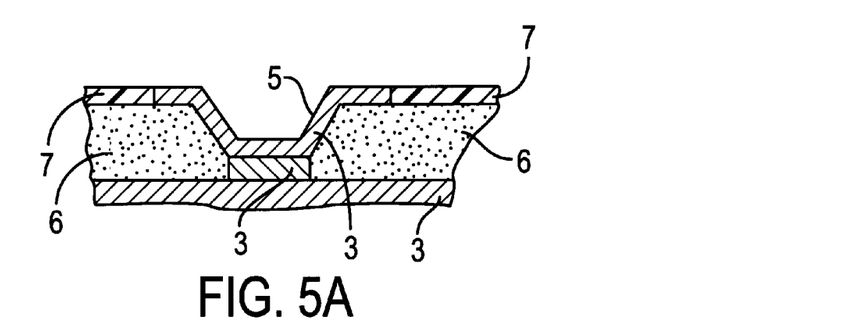
FIGS. 5(a), 5(b) and 5(c) are partial sectional views illustrating production steps of an embodiment of forming a solder bump on a mounting surface in the printed circuit board according to the invention.
Figure 5B:
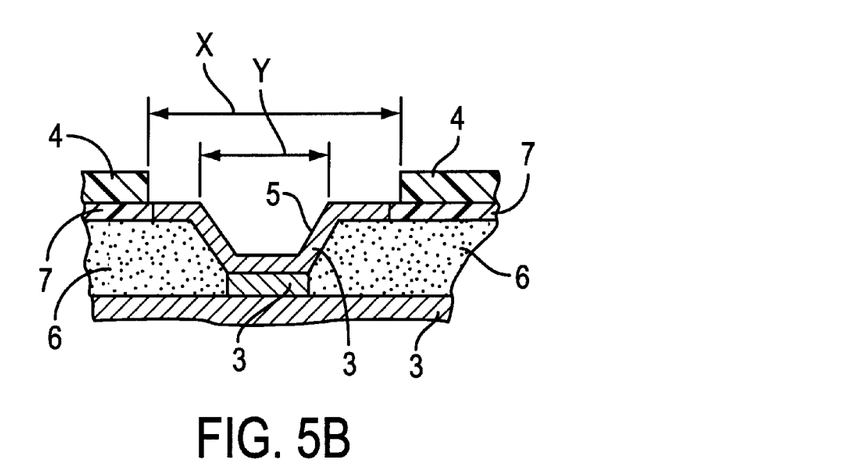
Figure 5C:
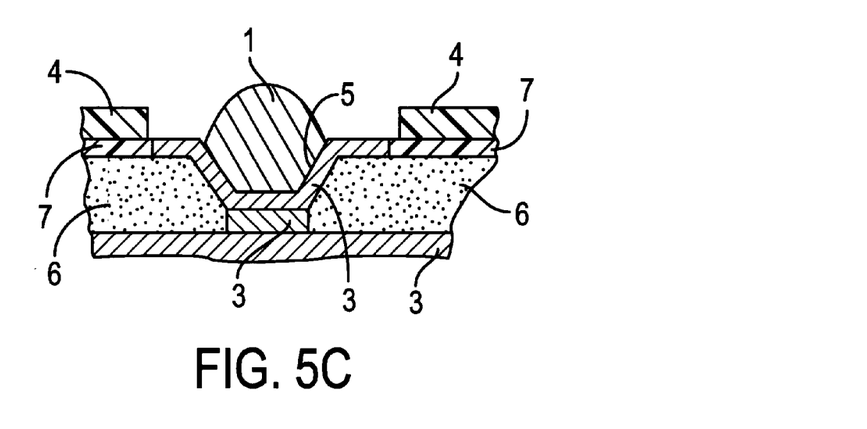

(8) If necessary, the steps of the items (2)–(8) are repeated, whereby a multilayer printed circuit board comprising conductor circuits inclusive of viaholes on the mounting surface is produced through a given method. In this case, pads for the formation of solder bump as in the conventional technique are not wired on the conductor circuit in the mounting surface of the printed circuit board. FIGS. 5(a)–5(c) are partial sectional views illustrating production steps of an embodiment for forming the solder bump on the mounting surface of the printed circuit board. The followings are described with reference with these figures.

(9) The conductor circuit 3 inclusive of viahole 5 on the mounting surface of the printed circuit board produced in the items (1)–(8) is subjected to Ni plating and Au plating in this order and then the solder resist 4 opening the viahole portion is formed by light exposure, development and the like so as to match a solder bump forming portion provided with an opening portion having a size X larger than an opening size Y of the viahole 5 with the viahole portion (see FIG. 5(b)).

(10) Then, a solder ball is fed to the inside of the viahole 5 and subjected to a reflow treatment, whereby the solder bump 1 is formed so as to completely fill the fused solder in the viahole 5 and to thereby produce the multilayer printed circuit board comprising the solder bump formed on the mounting surface (see FIG. 5(c)).

An example on the opening shape of the solder resist constituting the printed circuit board according to the invention will be described below with reference to FIG. 3.

EXAMPLE 1

On a substrate provided with an inner circuit layer is formed a conductor pattern including a mounting pad 2 as a mounting surface for an electronic part by an additive process. In this case, a size of the mounting pad 2 is 100 $\mu$m$\phi$.

Then, a surface of the permanent resist 7 is chemically roughened to form a solder resist 4 opening a portion of the mounting pad. In this case, the solder resist 4 has a film thickness of 20 $\mu$m and an opening size of 180 $\mu$m. Moreover, a clearance $\Delta X$ created between an opening edge of the solder resist and an outer peripheral edge of the mounting pad 2 is within a range of 25–55 $\mu$m.

Comparative Example 1

On a substrate provided with an inner circuit layer is formed a conductor pattern including a mounting pad 2 as a mounting surface for an electronic part by an additive process. In this case, a size of the mounting pad 2 is 100 $\mu$m$\phi$.

Then, a surface of the permanent resist 7 is chemically roughened to form a solder resist 4 opening a portion of the mounting pad. In this case, the solder resist 4 has a film thickness of 20 $\mu$m and an opening size of 90 $\mu$m, in which the outer peripheral edge of the pad is overlapped with the opening edge of the solder resist.

Comparative Example 2

On a substrate provided with an inner circuit layer is formed a conductor pattern including a mounting pad 2 as a mounting surface for an electronic part by an additive process. In this case, a size of the mounting pad 2 is 100 $\mu$m$\phi$.

Then, a surface of the permanent resist 7 is chemically roughened to form a solder resist 4 opening a portion of the mounting pad. In this case, the solder resist 4 has a film thickness of 20 $\mu$m and an opening size of 120 $\mu$m. Moreover, a clearance $\Delta X$ created between an opening edge of the solder resist and an outer peripheral edge of the mounting pad 2 is within a range of 0–20 $\mu$m.

Comparative Example 3

On a substrate provided with an inner circuit layer is formed a conductor pattern including a mounting pad 2 as a mounting surface for an electronic part by an additive process. In this case, a size of the mounting pad 2 is 100 $\mu$m$\phi$.

Then, a surface of the permanent resist 7 is chemically roughened to form a solder resist 4 opening a portion of the mounting pad. In this case, the solder resist 4 has a film thickness of 20 $\mu$m and an opening size of 300 $\mu$m. Moreover, a clearance Ax created between an opening edge of the solder resist and an outer peripheral edge of the mounting pad 2 is within a range of 80–120 $\mu$m.

Comparative Example 4

On a substrate provided with an inner circuit layer is formed a conductor pattern including a mounting pad 2 as a mounting surface for an electronic part by an additive process. In this case, a size of the mounting pad 2 is 100 $\mu$m$\phi$.

Then, a surface of the permanent resist 7 is chemically roughened to form a solder resist 4 opening a portion of the mounting pad. In this case, the solder resist 4 has a film thickness of 10 $\mu$m and an opening size of 180 $\mu$m. Moreover, a clearance $\Delta X$ created between an opening edge of the solder resist and an outer peripheral edge of the mounting pad 2 is within a range of 25–55 $\mu$m.

Comparative Example 5

On a substrate provided with an inner circuit layer is formed a conductor pattern including a mounting pad 2 as a mounting surface for an electronic part by an additive process. In this case, a size of the mounting pad 2 is 100 $\mu$m$\phi$.

Then, a surface of the permanent resist 7 is chemically roughened to form a solder resist 4 opening a portion of the mounting pad. In this case, the solder resist 4 has a film thickness of 40 $\mu$m and an opening size of 180 $\mu$m. Moreover, a clearance $\Delta X$ created between an opening edge of the solder resist and an outer peripheral edge of the mounting pad 2 is within a range of 25–55 $\mu$m.

In the printed circuit board provided with the conductor pattern including the mounting pad and the solder resist, the mounting pad is subjected to Ni/Au plating of 3 $\mu$m and the solder is fed through cream printing process and then the appearance, resistance to cold-heat shock and insulation property based on the difference of the opening shape in the solder resist are evaluated. The results are shown in Table 1.

TABLE 1

|  | Peeling of resist *1 | Test for resistance to cold-heat shock *2 | Insulation property *3 |
| --- | --- | --- | --- |
| Example 1 | none | more than 1000 cyc | ○ |
| Comparative Example 1 | presence | 500 cyc | ○ |
| Comparative Example 2 | presence | 500 cyc | ○ |

TABLE 1-continued

|  | Peeling of resist *1 | Test for resistance to cold-heat shock *2 | Insulation property *3 |
|---|---|---|---|
| Comparative Example 3 | none | more than 1000 cyc | X |
| Comparative Example 4 | none | more than 1000 cyc | X |
| Comparative Example 5 | presence | 500 cyc | ○ |

*1 peeling of solder resist; presence or absence of peeling by visual inspection
*2 test for resistance to cold-heat shock; time of creating cracks of solder resist in cycle test of −65° C. ←→ 125° C.
*3 insulation property; electrical insulation to adjacent conductor circuit (including adjacent pad), ○ is good and X is poor As seen from the results of Table 1, in the printed circuit board according to the invention, there is no peeling of the solder resist and the resistance to cold-heat shock and insulation property are excellent.

On the contrary, in the printed circuit board having the structure that the outer peripheral edge of the pad overlaps with the opening edge of the solder resist as shown in Comparative Example 1, the gap is created at the boundary face of the pad to the opening edge of the solder resists in the formation of the solder resist and hence the Ni/Au plating solution penetrates thereinto to progress the precipitation of the plated film and the peeling is caused in the opening edge of the solder resist. Therefore, crack is caused from the floating (peeling) portion in the test for the resistance to cold-heat shock.

As shown in Comparative Example 2, in the printed circuit board having a structure that the clearance ΔX created between the outer peripheral edge of the pad and the opening edge of the solder resist is made smaller than the lower limit defined in the invention, it is apt to create the alignment miss of the opening portion of the solder resist and a part of the conductor pad is covered with the solder resist to cause the drawback that the peeling is caused from the boundary face. Therefore, the crack is created from the floating (peeling) portion in the test for the resistance to cold-heat shock.

As shown in Comparative Example 3, in the printed circuit board having a structure that the opening size of the solder resist is made larger, the clearance ΔX created between the outer peripheral edge of the pad and the opening edge of the solder resist is larger than the upper limit defined in the invention, so that the adjoining conductor circuit is exposed to cause the electrical shortcircuit in the formation of the solder bump.

As shown in Comparative Example 4, in the printed circuit board having a structure that the film thickness of the solder resist is thinner than the lower limit defined in the invention, the solder is plied on the solder resist in the formation of the solder resist and hence the solder resist does not act as a solder dam and the bridge defect to the adjoining solder bump is caused to form an electrical shortcircuit.

As shown in Comparative Example 5, in the printed circuit board having a structure that the film thickness of the solder resist is thicker than the upper limit defined in the invention, the curing of the lower layer of the solder resist is insufficient and the floating is caused in the opening edge of the solder resist. Therefore, the crack is caused from the floating (peeling) portion in the test for the resistance to cold-heat shock. Further, since the film thickness of the solder resist is thick, a portion of the bump protruding from the opening of the solder resist is less and hence the electrical reliability lowers.

Then, an example on the forming state of the solder bump constituting the printed circuit board according to the invention will be described with reference to FIG. 4.

EXAMPLE 2

(1) An insulating resin is applied onto a substrate provided with an inner layer of conductor circuit by a given method and exposed to light and developed and cured to form an insulating layer 6 provided with a non-through hole for the formation of a viahole 5.

(2) Then, the surface of the insulating layer 6 is roughened by treating with chromic acid and a catalyst is applied to form a conductor portion opening plated resist 7 inclusive of a viahole 5 and a land portion thereof, which is then subjected to an electroless copper plating of 15 μm. In this case, an opening size Y of the viahole 5 is 120 μm, and a diameter Z of a land portion of the viahole 5 is 190 μm.

(3) Next, the conductor circuit 3 including the viahole 5 is subjected to Ni plating and Au plating in this order and thereafter a solder resist 4 opening the viahole 5 portion is formed through light exposure, development and the like. In this case, the solder resist 4 has a film thickness of 20 μm and an opening size of 250 μm.

(4) Further, a cream solder is printed through a metal mask by a doctor bar and the metal mask is removed. Thereafter, a solder bump 1 is formed by a printing method in which the solder is supplied through reflow to produce a printed circuit board.

EXAMPLE 3

(1) An insulating resin is applied onto a substrate provided with an inner layer of conductor circuit by a given method and cured to form an insulating layer 6. Then, a non-through hole for the formation of a viahole 5 having an opening size Y of 100 μm is formed in the insulating layer 6 through a laser.

(2) Then, the surface of the insulating layer 6 is roughened by treating with chromic acid and a catalyst is applied to form a conductor portion opening plated resist 7 inclusive of a viahole 5 and a land portion thereof, which is then subjected to an electroless copper plating of 15 μm. In this case, a diameter Z of a land portion of the viahole 5 is 150 μm.

(3) Next, the conductor circuit 3 including the viahole 5 is subjected to Ni plating and Au plating in, this order and thereafter a solder resist 4 opening the viahole 5 portion is formed through light exposure, development and the like. In this case, the solder resist 4 has a film thickness of 20 μm and an opening size of 200 μm. Further, a clearance ΔX created between the opening edge of the solder resist 4 and the outer peripheral edge of the land portion of the viahole 5 is within a range of 25–30 μm.

(4) A multilayer printed circuit board is produced by forming a solder bump 1 through a solder transfer method in which a solder sheet having a respective pattern is used and positioned and reflowed to supply the solder. In this case, the solder sheet has a film thickness of 35 μm and a pattern diameter of 120 μm, and the reflow of the solder is carried out at 245° C.

Comparative Example 6

(1) An insulating resin is applied onto a substrate provided with an inner layer of conductor circuit by a given method and exposed to light and developed and cured to form an insulating layer 6 provided with a non-through hole for the formation of a viahole 5 and an opening for a flat mounting pad.

(2) Then, the surface of the insulating layer 6 is roughened by treating with chromic acid and a catalyst is applied to form a conductor portion opening plated resist 7 inclusive of a mounting pad 2, which is then subjected to an electroless copper plating of 15 μm. In this case, a size of the pad is 200 μm.

(3) A solder resist 4 is formed by opening a portion of the mounting pad in the same manner as in Example 2 and the feeding of solder is carried out by the printing method to form a solder bump 1, whereby a printed circuit board is produced.

Comparative Example 7

(1) An insulating resin is applied onto a substrate provided with an inner layer of conductor circuit by a given method and exposed to light and developed and cured to form an insulating layer 6 provided with a non-through hole for the formation of a viahole 5.

(2) Then, the surface of the insulating layer 6 is roughened by treating with chromic acid and a catalyst is applied to form a conductor portion opening plated resist 7 inclusive of a viahole 5 and a land portion thereof, which is then subjected to an electroless copper plating of 15 μm. In this case, an opening size Y of the viahole 5 is 100 μm and a diameter Z of the land portion of the viahole 5 is 330 μm.

(3) A solder resist 4 is formed by opening a portion of the mounting pad in the same manner as in Example 2 and the feeding of solder is carried out by the printing method to form a solder bump 1, whereby a printed circuit board is produced.

Comparative Example 8

(1) An insulating resin is applied onto a substrate provided with an inner layer of conductor circuit by a given method and exposed to light and developed and cured to form an insulating layer 6 provided with a non-through hole for the formation of a viahole 5.

(2) Then, the surface of the insulating layer 6 is roughened by treating with chromic acid and a catalyst is applied to form a conductor portion opening plated resist 7 inclusive of a viahole 5 and a land portion thereof, which is then subjected to an electroless copper plating of 15 μm. In this case, an opening size Y of the viahole 5 is 50 μm and a diameter Z of the land portion of the viahole 5 is 70 μm.

(3) A solder resist 4 is formed by opening a portion of the mounting pad in the same manner as in Example 2 and the feeding of solder is carried out by the printing method to form a solder bump 1, whereby a printed circuit board is produced.

Comparative Example 9

(1) An insulating resin is applied onto a substrate provided with an inner layer of conductor circuit by a given method and exposed to light and developed and cured to form an insulating layer 6 provided with a non-through hole for the formation of a viahole 5.

(2) Then, the surface of the insulating layer 6 is roughened by treating with chromic acid and a catalyst is applied to form a conductor portion opening plated resist 7 inclusive of a viahole 5 and a land portion thereof, which is then subjected to an electroless copper plating of 15 μm. In this case, an opening size Y of the viahole 5 is 250 μm and a diameter Z of the land portion of the viahole 5 is 300 μm.

(3) A solder resist 4 is formed by opening a portion of the mounting pad in the same manner as in Example 2 and the feeding of solder is carried out by the printing method to form a solder bump 1, whereby a printed circuit board is produced.

Comparative Example 10

(1) An insulating resin is applied onto a substrate provided with an inner layer of conductor circuit by a given method and exposed to light and developed and cured to form an insulating layer 6 provided with a non-through hole for the formation of a viahole 5.

(2) Then, the surface of the insulating layer 6 is roughened by treating with chromic acid and a catalyst is applied to form a conductor portion opening plated resist 7 inclusive of a viahole 5 and a land portion thereof, which is then subjected to an electroless copper plating of 15 μm. In this case, an opening size Y of the viahole 5 is 30 μm and a diameter Z of the land portion of the viahole 5 is 80 μm.

(3) A solder resist 4 is formed by opening a portion of the mounting pad in the same manner as in Example 2 and the feeding of solder is carried out by the printing method to form a solder bump 1, whereby a printed circuit board is produced.

The observation of section of viahole 5, test for the resistance to cold-heat shock, evaluation of mounting numbers and evaluation of connection reliability are carried out with respect to the thus produced printed circuit boards to obtain results as shown in Table 2.

TABLE 2

|  | via/land *1 | Test for resistance to cold-heat shock *2 | SEM observation viahole section | Mounting number *3 | Connection reliability *4 |
|---|---|---|---|---|---|
| Example |  |  |  |  |  |
| 2 | 120/190 | more than 1000 cycles | no bubble | 10 | $3.5 \times 10^1$ |
| 3 | 100/150 | more than 1000 cycles | no bubble | 11 | $3.4 \times 10^1$ |
| Comparative Example |  |  |  |  |  |
| 6 | pad mounting | 500 cycles | presence of bubbles | 5 | $3.1 \times 10^1$ |

TABLE 2-continued

| | via/land *1 | Test for resistance to cold-heat shock *2 | SEM observation viahole section | Mounting number *3 | Connection reliability *4 |
|---|---|---|---|---|---|
| 7 | 100/330 | more than 1000 cycles | no bubble | 7 | $3.5 \times 10^1$ |
| 8 | 50/70 | more than 1000 cycles | no bubble | 14 | $5.2 \times 10^1$ |
| 9 | 250/300 | more than 1000 cycles | no bubble | 7 | $1.3 \times 10^1$ |
| 10 | 30/80 | more than 1000 cycles | no bubble | 13 | $7.4 \times 10^1$ |

*1 via/land; opening size of viahole ($\mu$m)/diameter of land ($\mu$m)
*2 test for the resistance to cold-heat shock; time of creating cracks of viahole portion in cycle test of $-65°$ C. ←→ $125°$ C.
*3 mounting number; number of mountable bumps per unit area relative to bump shape (size), provided that a distance between bumps is constant and number in Example 1 is 10.
*4 connection reliability; value of resistance ($\Omega$) in mounting portion as measured after 300 cycles of $-65°$ C. ←→ $125°$ C. (test for the resistance to cold-heat shock)

As seen from the results of Table 2, in the printed circuit boards according to the invention, the mounting is possible in a higher density, and no occurrence of bubble is caused in the viahole, and the resistance to cold-heat shock and the connection reliability are excellent.

As shown in Comparative Example 6, in the conventional printed circuit board forming the solder bump 1 by wiring the mounting pad 2 from the viahole 5, bubbles are existent in the resin filled in the viahole 5, so that cracks are apt to be caused in the test for the resistance to cold-heat shock to bring about the degradation of the connection reliability to the part. Further, the wiring density is lowered as compared with Examples 2 and 3 due to the wiring of the mounting pad 2 and hence the formation of higher mounting density (high mounting number) is not attained.

As shown in Comparative Examples 7–9, in the printed circuit boards having a structure that the opening size Y of the viahole 5 or the land diameter Z is outside the preferable range of the invention, it has been confirmed that at least one of the mounting density (mounting number) and the connection reliability to the part is poor as compared with the wiring boards of Examples 2 and 3. That is, when the opening size Y of the viahole 5 or the land diameter Z is larger as in Comparative Example 7 or 9, the wiring density is low and the solder bump 1 to be formed is large, so that the formation of higher mounting density (mounting number) is not attained. On the other hand, when the opening size Y of the viahole 5 or the land diameter Z is small as in Comparative Example 8 or 10, the bump 1 filled in the viahole 5 can not be formed so as to make higher than the solder resist 4, so that the electrical connection reliability to the part can not be ensured. Moreover, when the opening size Y of the viahole 5 is small, the electrical connection reliability between the viahole 5 and the conductor 3 located therebeneath is also poor.

INDUSTRIAL APPLICABILITY

As mentioned above, according to the invention, there can stably be provided printed circuit boards suitable for high densification of mounting parts using a solder bump and the improvements of connection reliability and mounting reliability.

Therefore, the printed circuit board according to the invention can easily cope with reductions of weight, thickness and length of substrate and exhibits an excellent adaptability in many fields requiring high performances and high densification of electronic parts.

What is claimed is:

1. A printed circuit board comprising a conductor pattern inclusive of a mounting pad on a mounting surface and a solder resist having a bottom surface located at a higher position than a top surface of the conductor pattern and the mounting pad, the solder resist covering the conductor pattern and having a thickness of 15–30 $\mu$m, and an opening in the solder resist formed through light exposure and development larger than the mounting pad so as not to overlap the solder resist with the pad, and wherein a clearance between an opening edge of the solder resist and an outer peripheral edge of the mounting pad is 20–60 $\mu$m.

2. A printed circuit board comprising a mounting pad including a solder bump formed by covering a mounting surface with a solder resist, wherein a position forming the solder bump is matched with a position of a viahole, and a size of an opening portion formed in the solder resist is larger than a land of the viahole so as not to overlap the solder resist with the viahole, so as to form a clearance between an opening edge of the solder resist and the land of the viahole of 20–60 $\mu$m.

3. The printed circuit board according to claim 2, wherein the solder bump is formed so as to fill the viahole on the mounting surface and cover a portion just above the viahole.

4. The printed circuit board according to claim 2, wherein a thickness of the solder resist is 15–30 $\mu$m.

5. The printed circuit board according to claim 2, wherein an opening diameter of the viahole having the solder bump is 50–220 $\mu$m.

6. The printed circuit board according to claim 2, wherein a land size of the viahole having the solder bump is 80–300 $\mu$m.

7. A printed circuit board comprising a mounting pad including a solder bump formed by covering a mounting surface with a solder resist, alternatingly laminated conductor circuits and interlaminar insulating layers, an interlaminar insulating layer between a surface layer of one conductor circuit and an inner layer of another conductor circuit including an opening portion exposing the inner layer of the another conductor circuit, wherein a viahole composed of a metal film electrically connecting the surface layer of the one conductor circuit to the inner layer of the another conductor circuit is formed in the opening portion, the viahole is filled with the solder bump, and a size of the opening portion formed in the solder resist is made larger than a land of the viahole so as not to overlap the solder resist with the viahole, so as to form a clearance between an opening edge of the solder resist and the land of the viahole of 20–60 μm.

8. The printed circuit board according to claim 7, wherein the solder bump is formed so as to fill the viahole on the mounting surface and cover a portion just above the viahole.

9. The printed circuit board according to claim 7, wherein the viahole has a structure that the metal film for electrically connecting the inner layer to the surface layer is formed in a concave opening formed in the insulating layer provided on both surfaces with the one conductor circuit and the another conductor circuit so as to expose the inner layer from a surface of the insulating layer.

10. The printed circuit board according to claim 7, wherein a thickness of the solder resist is 15–30 μm.

11. The printed circuit board according to claim 7, wherein an opening diameter of the viahole having the solder bump is 50–220 μm.

12. The printed circuit board according to claim 7, wherein a land size of the viahole having the solder bump is 80–300 μm.

13. A printed circuit board comprising a solder bump on a mounting surface, and conductor circuits and interlaminar insulating layers alternatingly laminated on a substrate through etching of copper lined laminate, an interlaminar insulating layer positioned between a surface layer of one conductor circuit and an inner layer of another conductor circuit including an opening portion exposing the inner layer of the another conductor circuit, a viahole composed of a metal film electrically connecting the surface layer of the one conductor circuit to the inner layer of the another conductor circuit so as to match a position of the viahole with a position of the solder bump, in which a surface of said interlaminar insulating layer is roughened, and a solder resist having an opening around the viahole so as to form a clearance of 20–60 μm between an opening edge of the solder resist and an outer peripheral edge of a land portion of the viahole.

14. A printed circuit board comprising a solder bump on a mounting surface, and conductor circuits and interlaminar insulating layers alternatingly laminated on a substrate through etching of copper lined laminate, an interlaminar insulating layer positioned between a surface layer of one conductor circuit and an inner layer of another conductor circuit including an opening portion exposing the inner layer of the another conductor circuit, a viahole composed of a metal film electrically connecting the surface layer of the one conductor circuit to the inner layer of the another conductor circuit, a solder bump filling said viahole, in which a surface of said interlaminar insulating layer is roughened, and a solder resist having an opening around the viahole so as to form a clearance of 20–60 μm between an opening edge of the solder resist and an outer peripheral edge of a land portion of the viahole.

15. A printed circuit board comprising a solder bump on a mounting surface, and conductor circuits and interlaminar insulating layers alternatingly laminated on a resin substrate, an interlaminar insulating layer positioned between a surface layer of one conductor circuit and an inner layer of another conductor circuit including an opening portion exposing the inner layer of the another conductor circuit, a viahole composed of a metal film electrically connecting the surface layer of the one conductor circuit to the inner layer of the another conductor circuit so as to match a position of the viahole with a position of the solder bump, said viahole comprising copper and provided at its surface side with metal films of nickel and gold in this order, and a solder resist having an opening around the viahole so as to form a clearance of 20–60 μm between an opening edge of the solder resist and an outer peripheral edge of a land portion of the viahole.

16. A printed circuit board comprising a solder bump on a mounting surface, and conductor circuits and interlaminar insulating layers alternatingly laminated on a resin substrate, an interlaminar insulating layer positioned between a surface layer of one conductor circuit and an inner layer of another conductor circuit including an opening portion exposing the inner layer of the another conductor circuit, a viahole composed of a metal film electrically connecting the surface layer of the one conductor circuit to the inner layer of the another conductor circuit, a solder bump filling said viahole, said viahole being made from copper and provided at its surface side with metal films of nickel and gold in this order, and a solder resist having an opening around the viahole so as to form a clearance of 20–60 μm between an opening edge of the solder resist and an outer peripheral edge of a land portion of the viahole.

17. A printed circuit board comprising a solder bump on a mounting surface, and conductor circuits and interlaminar insulating layers alternatingly laminated on a resin substrate, an interlaminar insulating layer positioned between a surface layer of one conductor circuit and an inner layer of another conductor circuit including an opening portion exposing the inner layer of the another conductor circuit, a viahole composed of a metal film electrically connecting the surface layer of the one conductor circuit to the inner layer of the another conductor circuit so as to match a position of the viahole with a position of the solder bump, said interlaminar insulating layer being made from a thermoplastic resin, or a composite of a thermoplastic resin and a thermosetting resin or a composite of a thermoplastic resin and a photosensitive resin, and a solder resist having an opening around the viahole so as to form a clearance of 20–60 μm between an opening edge of the solder resist and an outer peripheral edge of a land portion of the viahole.

18. A printed circuit board comprising a solder bump on a mounting surface, and conductor circuits and interlaminar insulating layers alternatingly laminated on a resin substrate, an interlaminar insulating layer positioned between a surface layer of one conductor circuit and an inner layer of another conductor circuit including an opening portion exposing the inner layer of the another conductor circuit, a viahole composed of a metal film electrically connecting the surface layer of the one conductor circuit to the inner layer of the another conductor circuit, a solder bump filling said viahole, said interlaminar insulating layer being made from a thermoplastic resin, or a composite of a thermoplastic resin and a thermosetting resin or a composite of a thermoplastic resin and a photosensitive resin, and a solder resist having an opening around the viahole so as to form a clearance of 20–60 μm between an opening edge of the solder resist and an outer peripheral edge of a land portion of the viahole.

* * * * *

UNITED STATES PATENT AND TRADEMARK OFFICE
CERTIFICATE OF CORRECTION

PATENT NO. : 6,291,778 B1
DATED : September 18, 2001
INVENTOR(S) : M. Asai et al.

It is certified that error appears in the above-identified patent and that said Letters Patent is hereby corrected as shown below:

Title page,
Item [57], ABSTRACT, the ABSTRACT should be deleted and the following should be inserted:
-- Printed circuit board suitable for the high densification of mounting parts using a solder bump and having improved connection and mounting reliability, wherein the printed circuit board includes a mounting pad provided with a solder bump by covering the mounting surface with a solder resist, and a position of forming the solder bum is arranged so as to match with a position of the viahole, or a size of the opening portion formed in the solder resist is made larger than a size of a land of the viahole so as not be overlap the solder resist with the viahole. --

Item [56], References Cited, OTHER PUBLICATIONS, the following reference was omitted and should be included:
-- Newman et al., Physics in Technology, pages 10-17, January 1997, "Glass-Epoxy Multilayer Materials for Printed Circuits." --
Item [73], Assignee, after "Ibiden" delete ",".

Signed and Sealed this

Seventeenth Day of September, 2002

Attest:

Attesting Officer

JAMES E. ROGAN
*Director of the United States Patent and Trademark Office*